United States Patent
Yang (10) Patent No.: US 9,508,749 B2
(45) Date of Patent: Nov. 29, 2016

(54) DISPLAY SUBSTRATES AND METHODS OF MANUFACTURING DISPLAY SUBSTRATES

(71) Applicant: Samsung Display Co., Ltd., Yongin, Gyeonggi-Do (KR)

(72) Inventor: Yong-Ho Yang, Suwon-si (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 0 days.

(21) Appl. No.: 14/510,618

(22) Filed: Oct. 9, 2014

(65) Prior Publication Data

US 2015/0102355 A1  Apr. 16, 2015

(30) Foreign Application Priority Data

Oct. 14, 2013  (KR) .................. 10-2013-0122068

(51) Int. Cl.
*H01L 27/12*  (2006.01)
*H01L 29/786*  (2006.01)

(52) U.S. Cl.
CPC ......... *H01L 27/124* (2013.01); *H01L 27/1237* (2013.01); *H01L 27/1259* (2013.01); *H01L 29/78645* (2013.01)

(58) Field of Classification Search
CPC ... H01L 27/124; H01L 29/36; H01L 21/266; H01L 27/1288; H01L 27/1237; H01L 29/78645
See application file for complete search history.

(56) References Cited

U.S. PATENT DOCUMENTS

| | | |
|---|---|---|
| 5,780,858 A | 7/1998 | Waechter et al. |
| 6,320,222 B1 | 11/2001 | Forbes et al. |
| 6,532,165 B1 | 3/2003 | Katori |
| 2002/0167025 A1* | 11/2002 | Nagao et al. ............... 257/200 |
| 2004/0195568 A1* | 10/2004 | Okumura ..................... 257/59 |
| 2005/0092992 A1 | 5/2005 | Nagata et al. |
| 2005/0140302 A1 | 6/2005 | Park |
| 2006/0066512 A1 | 3/2006 | Afentakis et al. |
| 2011/0079784 A1 | 4/2011 | Im |
| 2011/0121300 A1 | 5/2011 | Miyairi et al. |
| 2011/0128265 A1 | 6/2011 | Marhefka et al. |
| 2012/0049190 A1 | 3/2012 | Miyairi |
| 2012/0249510 A1 | 10/2012 | Jankovic et al. |

FOREIGN PATENT DOCUMENTS

| | | |
|---|---|---|
| KR | 10-2005-0068854 | 7/2005 |
| KR | 10-2011-0037220 | 4/2011 |
| KR | 10-2013-0019119 | 2/2013 |

* cited by examiner

*Primary Examiner* — Ermias Woldegeorgis
(74) *Attorney, Agent, or Firm* — Robert E. Bushnell, Esq.

(57) ABSTRACT

A display substrate and a method of manufacturing a display substrate are disclosed. The display substrate includes an active pattern, a first gate electrode and a second gate electrode. The active pattern is disposed on a base substrate. The first gate electrode overlaps the active pattern. The first gate electrode is spaced apart from the active pattern by a first distance. The second gate electrode overlaps the active pattern. The second gate electrode is spaced apart from the active pattern by a second distance which is larger than the first distance.

18 Claims, 10 Drawing Sheets

DISPLAY SUBSTRATES AND METHODS OF MANUFACTURING DISPLAY SUBSTRATES

CLAIM OF PRIORITY

This application makes reference to, incorporates the same herein, and claims all benefits accruing under 35 U.S.C. §119 from an application earlier filed in the Korean Intellectual Property Office on 14 Oct. 2013 and there duly assigned Serial No. 10-2013-0122068.

BACKGROUND OF THE INVENTION

1. Field of the Invention

Example embodiments relate to display substrates and methods of manufacturing display substrates. More particularly, example embodiments relate to display substrate embedded in organic light emitting display devices and methods of manufacturing the same.

2. Description of the Related Art

An organic light emitting display (OLED) device may display desired information such as images, letters and/or characters using light generated by the combination of holes provided from an anode and electrons provided from a cathode in an organic layer thereof. The OLED device may have several advantages such as wide viewing angle, high response time, thin thickness and low power consumption, so that the OLED device may be widely employed in various electrical and electronic apparatuses. Recently, the OLED device has been rapidly developed as one of the most promising display devices.

Each of sub-pixels in the display substrate of the OLED device may include at least two thin film transistors. One of the thin film transistors may control a current flow between a source electrode and a drain electrode depending on an electrical signal applied to a gate electrode. However, a leakage current may occur between the source electrode and the drain electrode, so that an image quality of the OLED device may be degenerated.

The above information disclosed in this Background section is only for enhancement of understanding of the background of the invention and therefore it may contain information that does not form the prior art that is already known in this country to a person of ordinary skill in the art.

SUMMARY OF THE INVENTION

Example embodiments provide a display substrate which is capable of preventing the leakage current.

Example embodiments provide a method of manufacturing a display substrate which is capable of preventing the leakage current.

According to example embodiments, there is provided a display substrate including an active pattern, a first gate electrode and a second gate electrode. The active pattern is disposed on a base substrate. The first gate electrode overlaps the active pattern. The first gate electrode is spaced apart from the active pattern by a first distance. The second gate electrode overlaps the active pattern. The second gate electrode is spaced apart from the active pattern by a second distance which is larger than the first distance.

In example embodiments, the display substrate may further include a first gate insulation layer and a second gate insulation layer. The first gate insulation layer may be disposed on the base substrate. The first gate insulation layer may cover the active pattern. The second gate insulation layer may be disposed on the first gate insulation layer. The second gate insulation layer may cover the first gate electrode. The first gate electrode may be disposed on the first gate insulation layer, and the second gate electrode may be disposed on the second gate insulation layer.

In example embodiments, the first gate electrode may not overlap the second gate electrode.

In example embodiments, the first gate electrode may have a first width. The second gate electrode may have a second width. The first gate electrode and the second gate electrode may be spaced apart from each other by a third distance which may be smaller than the first width or the second width.

In example embodiments, the active pattern may include a first impurity region, a second impurity region, a third impurity region, a first channel region and a second channel region. The first channel region may be disposed between the first impurity region and the second impurity region. The second channel region may be disposed between the second impurity region and the third impurity region.

In example embodiments, the display substrate may further include a source electrode electrically connected to the first impurity region of the active pattern and a drain electrode electrically connected to the third impurity region of the active pattern.

In example embodiments, the source electrode may be disposed adjacent to the first gate electrode, and the drain electrode may be disposed adjacent to the second gate electrode.

In example embodiments, the active pattern may further include a fourth impurity region between the second channel region and the second impurity region and a fifth impurity region between the second channel region and the third impurity region.

In example embodiments, the fourth impurity region may have an impurity concentration which may be smaller than an impurity concentration of the second impurity region. The fifth impurity region may have an impurity concentration which may be smaller than an impurity concentration of the third impurity region.

In example embodiments, the second channel region may overlap the second gate electrode. The second channel region may have a width which may be the same as a width of the second electrode.

In example embodiments, the second channel region may overlap the second gate electrode. The second channel region may have a width which may be larger than a width of the second electrode.

In example embodiments, the display substrate may further comprise a first gate line electrically connected to the first gate electrode and a second gate line electrically connected to the second gate electrode.

In example embodiments, the first gate line and the second gate line may be partially overlapped from each other. The first gate line and the second gate line may be electrically isolated by the second gate insulation layer.

According to example embodiments, there is provided a method of manufacturing a display substrate. In the method, an active pattern is formed on a base substrate. A first gate insulation layer is formed on the base substrate to cover the active pattern. A first gate electrode is formed on the first gate insulation layer. The first gate electrode overlaps the active pattern. A second gate insulation layer is formed on the first gate insulation layer to cover the first gate electrode. A second gate electrode is formed on the second gate insulation layer. The second gate electrode overlaps the active pattern.

In example embodiments, impurities may be implanted into the active pattern using the first gate electrode and the second gate electrode as an ion implanting mask.

In example embodiments, implanting the impurities may include forming a first impurity region, a second impurity region and a third impurity region in the active pattern. A first channel region may be defined as a region between the first impurity region and the second impurity region. A second channel region may be defined as a region between the second impurity region and the third impurity region.

In example embodiments, forming the second electrode may include forming a second gate electrode layer on the second gate insulation layer, forming a photoresist pattern on the second gate electrode layer and partially removing the second gate electrode layer using the photoresist pattern as an etching mask.

In example embodiments, first impurities may be implanted into the active pattern using the photoresist pattern and the first gate electrode as an ion implanting mask. The photoresist pattern may have a width which may be larger than a width of the second gate electrode.

In example embodiments, the photoresist pattern may be removed. Second impurities may be implanted into the active pattern using the first gate electrode and the second gate electrode as an ion implanting mask. A concentration of the second impurities may be smaller than a concentration of the first impurities.

According to example embodiments, a thin film transistor of a display substrate may include an active pattern, a first gate electrode and a second gate electrode. A second distance between the active pattern and the second gate electrode may be larger than a first distance between an active pattern and a first gate electrode. Therefore, the second gate electrode may effectively prevent or reduce a leakage current. Further, the first gate electrode and the second gate electrode may be disposed at different levels, so that a third distance may be smaller than a resolution of an etching process for forming the first gate electrode or the second gate electrode. Therefore, an area occupied by the thin film transistor may decrease.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE EMBODIMENTS

Various example embodiments will be described more fully hereinafter with reference to the accompanying drawings, in which some example embodiments are shown. The invention may, however, be embodied in many different forms and should not be construed as limited to the example embodiments set forth herein. Rather, these example embodiments are provided so that this description will be thorough and complete, and will fully convey the scope of the invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the invention. As used herein, the singular forms "a," "an" and "the" are intended to include a plurality of forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
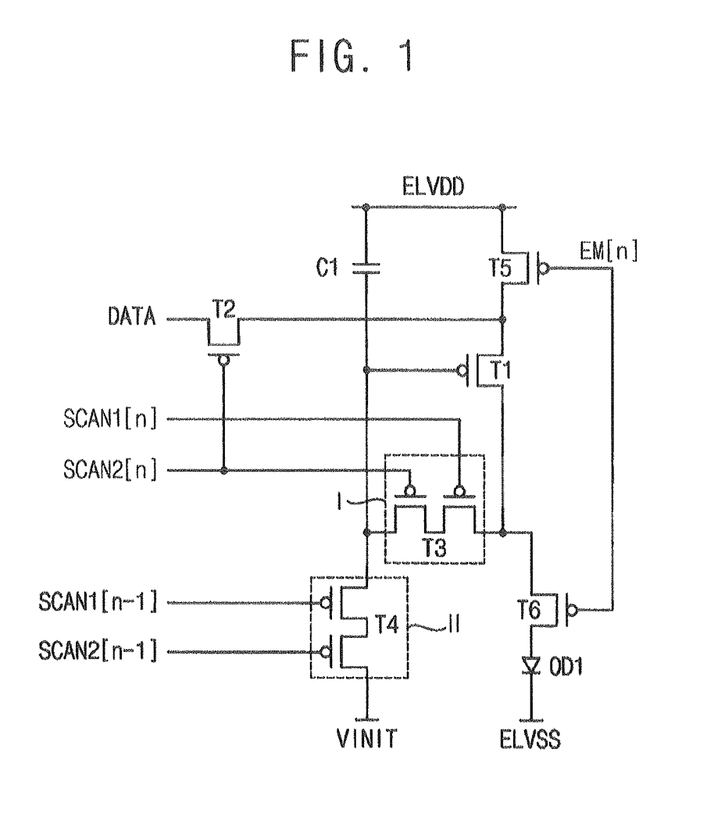
FIG. 1 is a circuit diagram illustrating a pixel circuit of a display substrate in accordance with example embodiments.

FIG. 1 is a circuit diagram illustrating a pixel circuit of a display substrate in accordance with example embodiments.

In reference to FIG. 1, the display substrate include a plurality of signal lines and a plurality of sub pixels which may be defined by the signal lines and may be arranged in a matrix form.

In example embodiments, the plurality of signal lines may include a plurality of first gate lines scan1[n] and scan1[n−1], a plurality of second gate lines scan2[n] and scan2[n−1], a plurality of data lines DATA and a driver voltage line ELVDD.

Each of the sub pixels may include at least two thin film transistors, at least one capacitor and at least one organic light emitting diode. In example embodiments, each of the sub pixels may include a first transistor T1, a second transistor T2, a third transistor T3, a fourth transistor T4, a fifth transistor T5, a sixth transistor T6, a first capacitor C1 and an organic light emitting diode OD1.

In this case, the data line DATA may be electrically connected to a source electrode of the second transistor T2, even first gate line scan1[n] and even second gate line scan2[n] may be electrically connected to a first gate electrode and a second gate electrode of the third transistor T3, respectively (See region I). Further, odd first gate line scan1[n−1] and odd second gate line scan2[n−1] may be electrically connected to a first gate electrode and a second gate electrode of the fourth transistor T4 (See region II). The first capacitor C1 may be disposed between the driver voltage line ELVDD and a drain electrode of the fourth transistor T4, and the organic light emitting diode OD1 may be electrically connected to a drain electrode of the sixth transistor T6.

That is, each of the third transistor T3 and the fourth transistor T4 may have a dual gate structure that may include the first and second gate electrodes electrically connected to the first and second gate lines, respectively. Therefore, the third transistor T3 and the fourth transistor T4 are capable of preventing or reducing a leakage current.

Figure 2:
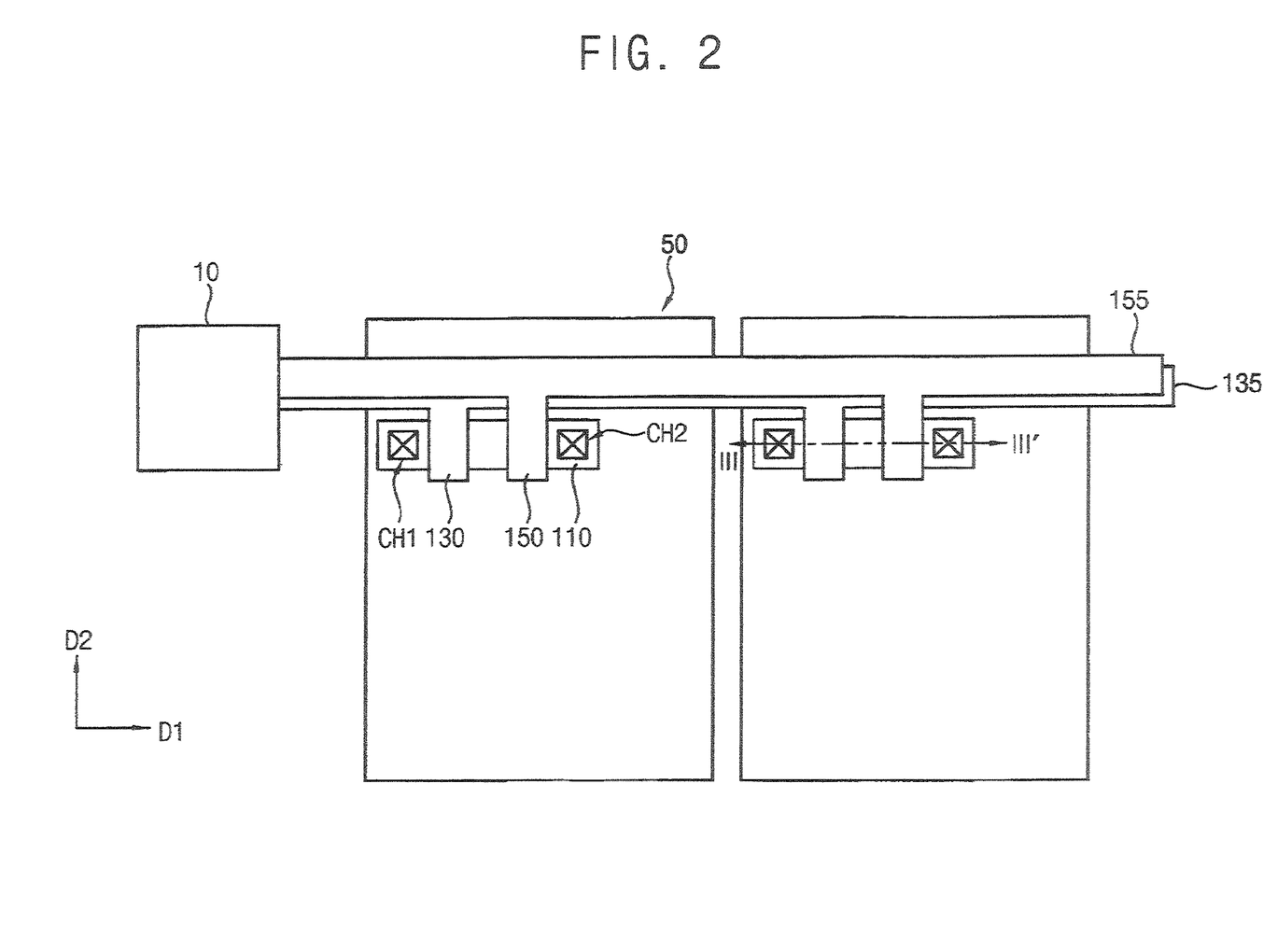
FIG. 2 is a plan view illustrating gate lines and a thin film transistor in region I or region II of FIG. 1.
Figure 3:
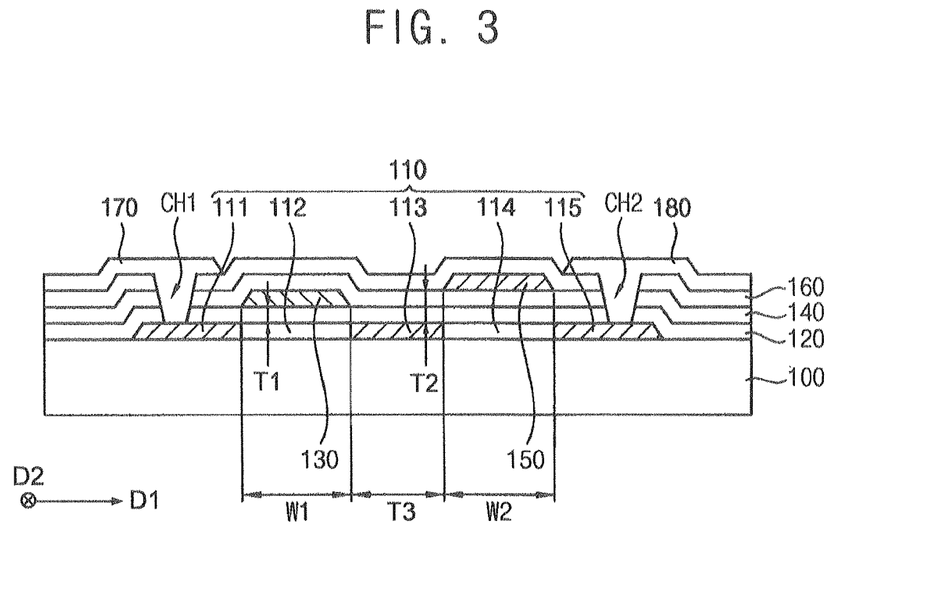
FIG. 3 is a cross-sectional view cut along the line III-III' in FIG. 2 in accordance with some example embodiments.

FIG. 2 is a plan view illustrating gate lines and a thin film transistor in region I or region II of FIG. 1, and FIG. 3 is a cross-sectional view cut along the line III-III' in FIG. 2 in accordance with some example embodiments. For the convenience of the explanation, FIGS. 2 and 3 do not show all elements of the vertical memory device. That is, some elements thereof, e.g., a data lines, a driver voltage line, a capacitor, etc. may be omitted in FIGS. 2 and 3.

In reference to FIGS. 2 and 3, the display substrate may include a base substrate, a scan circuit portion 10, a plurality of gate lines 135 and 155, and a thin film transistor. Further, the thin film transistor may include an active pattern 110, a first gate insulation layer 120, a first gate electrode 130, a second gate insulation layer 140, a second gate electrode 150, an insulation layer 160, a source electrode 170 and a drain electrode 180.

The base substrate 100 may include a transparent insulation material. For example, the base substrate 100 may include a glass substrate, a transparent plastic substrate, a transparent ceramic substrate, etc. In other example embodiments, the base substrate 100 may include a flexible substrate.

The scan circuit portion 10 may transfer an electrical signal to the thin film transistor through the plurality of gate lines 135 and 155.

The active pattern 110 may be disposed on the base substrate 100. For example, the active pattern 100 may have a shape extending in a first direction D1 as illustrated in FIG. 2.

In an example embodiment, the active pattern 110 may include amorphous silicon, polysilicon, doped silicon, doped polysilicon, partially crystallized silicon, etc. Alternatively, the active pattern 110 may include an oxide semiconductor. That is, the active pattern 110 may include oxide of indium, zinc, gallium, tin or hafnium. For example, the active pattern 120 may include indium-zinc-tin oxide ("IZTO"), indium-gallium-zinc oxide ("IGZO") or hafnium-indium-zinc oxide ("HIZO").

In example embodiments, the active pattern 110 may be divided into a first impurity region 111, a second impurity region 113, a third impurity region 115, a first channel region 112 and a second channel region 114 depending on a concentration of impurities. In this case, each of the first impurity region 111, the second impurity region 113 and the third impurity region 115 may have an impurity concentration that may be larger than those of the first channel region 112 and the second channel region 114. For example, when the active pattern 110 includes amorphous silicon or polysilicon, the impurity regions 111, 113 and 115 may have relatively high concentration of n-type impurities or p-type impurities. Alternatively, when the active pattern 110 includes an oxide semiconductor, the impurity regions 111, 113 and 115 may have relatively high concentration of hydrogen or fluorine. Therefore, the impurity regions 111, 113 and 115 may have an electrical conductivity that may be larger than those of the first channel region 112 and the second channel region 114.

The first impurity region 111, the second impurity region 113 and the third impurity region 115 may be spaced apart from one another. For example, the first channel region 112 may be disposed between the first impurity region 111 and the second impurity region 113, and the second channel region 114 may be disposed between the second impurity region 113 and the third impurity region 115. In this case, the first channel region 112 may have a first width W1 in the first direction D1, and the second channel region 114 may have a second width W2 in the first direction D1.

In example embodiments, the first impurity region 111 may serve as a source region of the thin film transistor, and the third impurity region 115 may serve as a drain region of the thin film transistor. Further, the second impurity region 113 may serve to electrically connect the first channel region 112 and the second channel region 114.

The first insulation layer 120 may be disposed on the base substrate 100 to cover the active pattern 110. Therefore, the active pattern 110 may be electrically isolated. In example embodiments, the first gate insulation layer 120 may include silicon oxide or silicon nitride. Alternatively, the first gate insulation layer 120 may include high-k dielectric materials, e.g., $HfO_2$, HfON, $HfSi_2O$, HfSiO, HfSiON, HfAlO, HfLaO, $La_2O_3$, etc. The first gate insulation layer 120 may have a thickness of about 1000 Å to about 2000 Å. More particularly, the first gate insulation layer 120 may have a thickness of about 1400 Å.

The first gate electrode 130 and the first gate line 135 may be disposed on the gate insulation layer 120.

The first gate line 135 may extend in the first direction D1 as illustrated in FIG. 2, and one end portion of the first gate line 135 may be electrically connected to the scan circuit portion 10. Further, the first gate electrode 130 may be electrically connected to the first gate line 135. For example, the first gate electrode 130 may protrude in a second direction D2 from the first gate line 135.

The first gate electrode 130 and the first gate line 135 may include the same material and may have the same thickness. For example, the first gate electrode 130 and the first gate line 135 may include copper, silver, chromium, molybdenum, aluminum, titanium, manganese, aluminum or alloys thereof. The first gate electrode 130 and the first gate line 35 may have a single layered structure or a multi layered structure including a plurality of metal layers and a plurality of conductive oxide layers.

In example embodiments, the first gate electrode 130 and the first gate line 135 may have a thickness of about 2000 Å to about 3000 Å. More particularly, the first gate electrode 130 and the first gate line 135 may have a thickness of about 2500 Å.

Further, the first gate electrode 130 may be disposed to overlap the active pattern 110. That is, the first gate electrode 130 may overlap the first channel region 112 of the active pattern 110. In example embodiments, the first gate electrode 130 may have a first width W1 in the first direction D1, the first width W1 of the first gate electrode 130 may be substantially the same as that of the first channel region 112. For example, the first width W1 may be between about 2 μm to about 4 μm.

The first gate electrode 130 may be spaced apart from the active pattern 110 by a first distance T1 which may be substantially the same as a thickness of the first gate insulation layer 120.

The second gate insulation layer 140 may be disposed on the first gate insulation layer 120 to cover the first gate electrode 130 and the first gate line 135. In example embodiments, the second gate insulation layer 140 may include a material substantially the same as that of the first gate insulation layer 120. The second gate insulation layer 140 may have a thickness of about 1000 Å to about 2000 Å. In example embodiments, the thickness of the second gate insulation layer 140 may be smaller than that of the first gate insulation layer 120. More particularly, the second gate insulation layer 140 may have a thickness of about 1200 Å.

The second gate electrode 150 and the second gate line 155 may be disposed on the second gate insulation layer 140.

The second gate line 155 may extend in the first direction D1 as illustrated in FIG. 2, and one end portion of the second gate line 155 may be electrically connected to the scan circuit portion 10. Further, the second gate electrode 150 may be electrically connected to the second gate line 155. For example, the second gate electrode 150 may protrude in the second direction D2 from the second gate line 155.

The second gate electrode 150 and the second gate line 155 may include the same material and may have the same thickness. For example, the second gate electrode 150 and the second gate line 155 may include a material substantially the same as that of the first gate electrode 130 and the first gate line 135. Further, the second gate electrode 150 and the second gate line 155 may have a thickness substantially the same as that of the first gate electrode 130 and the first gate line 135.

Further, the second gate line 155 may be disposed to partially overlap the first gate line 135. However, the second gate insulation layer 140 may be disposed between the first gate line 135 and the second gate line 155, so that the first gate line 135 and the second gate line 155 may be electrically isolated from each other. In other example embodiment, the scan circuit portion 10 may transfer different electrical signals to the first gate line 135 and the second gate line 155.

The second gate electrode 150 may be disposed to overlap the active pattern 110. That is, the second gate electrode 150 may overlap the second channel region 114 of the active pattern 110, and may not overlap the first channel region 112. In example embodiments, the second gate electrode 150 may have a second width W2 in the first direction D1, the second width W2 of the second gate electrode 150 may be substantially the same as that of the second channel region 114. For example, the second width W2 may be between about 2 μm to about 4 μm.

The first gate electrode 130 and the second gate electrode 150 may be spaced apart from each other by a third distance T3. In example embodiments, the third distance T3 may be smaller than the first width W1 or the second width W2. For example, the third distance T3 may be between about 0.7 μm and about 2 μm. The first gate electrode 130 and the second gate electrode 150 may be disposed at different levels, so that the third distance T3 may be smaller than a resolution of an etching process for forming the first gate electrode 130 or the second gate electrode 150. As the third distance T3 decreases, an area occupied by the thin film transistor may decrease.

Further, the second gate electrode 150 may be spaced apart from the active pattern 110 by a second distance T2 which may be substantially the same as a sum of thicknesses of the first gate insulation layer 120 and the second gate insulation layer 140. That is, the second distance T2 between the active pattern 110 and the second gate electrode 150 may be larger than the first distance T1 between the active pattern 110 and the first gate electrode 130. As a distance between the active pattern 110 and a gate electrode increases, the thin film transistor may effectively prevent or reduce a leakage current (See FIG. 18). Therefore, the second gate electrode 150 may effectively prevent or reduce the leakage current.

In an example embodiment, the first gate electrode 130 may be disposed adjacent to the source electrode 170, and the second gate electrode 150 may be disposed adjacent to the drain electrode 180. In this case, the second gate electrode 150 may effectively reduce or prevent the gate induced drain leakage (GIDL) current compared to other cases in which the second gate electrode 150 is disposed adjacent to the source electrode 170.

The insulation layer 160 may be disposed on the second gate insulation layer 140 to cover the second gate 150 and the second gate line 155. In example embodiments, the insulation layer 160 may include a material substantially the same as or similar to that of the second gate insulation layer 150. The insulation layer 160 may have a thickness of about 1000 Å to about 4000 Å.

The source electrode 170 may be disposed on the insulation layer 160. The source electrode 170 may be electrically connected to the first impurity region 111 of the active pattern 111 by a first contact hole CH1 penetrating the first gate insulation layer 120, the second gate insulation layer 140 and the insulation layer 160. The source electrode 170 may include a metal or a conductive oxide material.

The drain electrode 180 may be disposed on the insulation layer 160. The drain electrode 180 may be electrically connected to the third impurity region 115 of the active pattern 111 by a second contact hole CH2 penetrating the first gate insulation layer 120, the second gate insulation layer 140 and the insulation layer 160. The drain electrode 180 may include a metal or a conductive oxide material.

According to example embodiments, the thin film transistor of the display substrate may include the active pattern 110, the first gate electrode 130 and the second gate electrode 150. The second distance T2 between the active pattern 110 and the second gate electrode 150 may be larger than the first distance T1 between the active pattern 110 and the first gate electrode 130. Therefore, the second gate electrode 150 may effectively prevent or reduce the leakage current. Further, the first gate electrode 130 and the second gate electrode 150 may be disposed at different levels, so that the third distance T3 may be smaller than a resolution of an etching process for forming the first gate electrode 130 or the second gate electrode 150.

Figure 4:
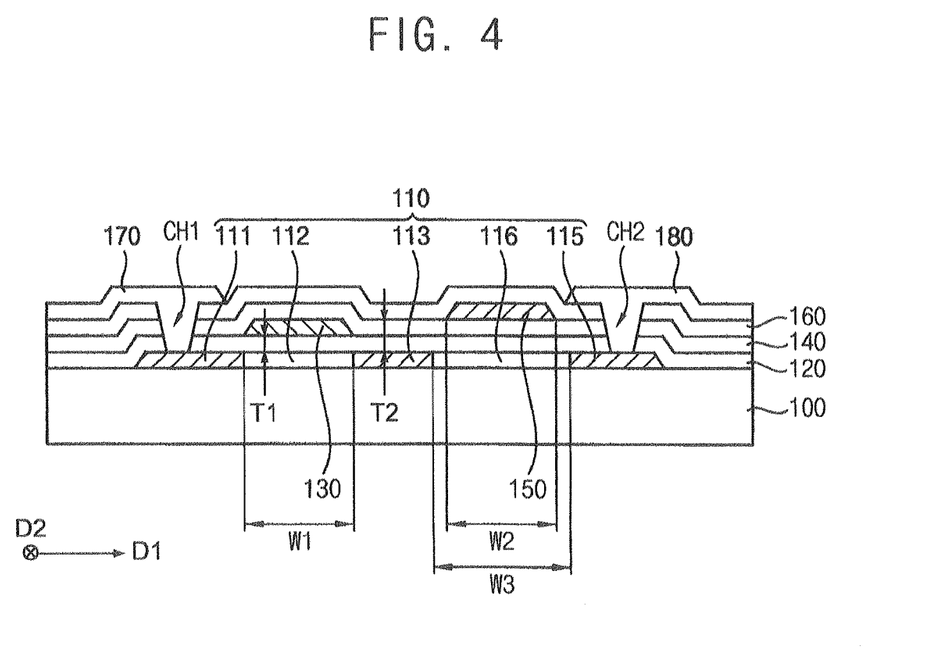
FIG. 4 is a cross-sectional view cut along the line III-III' in FIG. 2 in accordance with some example embodiments.

FIG. 4 is a cross-sectional view cut along the line III-III' in FIG. 2 in accordance with some example embodiments.

In reference to FIG. 4, a display substrate may include a thin film transistor, and the thin film transistor may include a base substrate 100, an active pattern 110, a first gate insulation layer 120, a first gate electrode 130, a second gate insulation layer 140, a second gate electrode 150, an insulation layer 160, a source electrode 170 and a drain electrode 180.

The active pattern 110 may be disposed on the base substrate 100. In example embodiments, the active pattern 110 may include amorphous silicon, polysilicon, doped silicon, doped polysilicon, partially crystallized silicon, etc. Alternatively, the active pattern 110 may include an oxide semiconductor such as IZTO, IGZO or HIZO.

In example embodiments, the active pattern 110 may be divided into a first impurity region 111, a second impurity region 113, a third impurity region 115, a first channel region 112 and a second channel region 116. In this case, the impurity regions 111, 113 and 115 may have impurity concentration which may be larger than those of the first channel region 112 and the second channel region 116.

The first channel region 112 may have a first width W1 in a first direction D1, and the second channel region 116 may have a third width W3 in the first direction D1. In example embodiments, the third width W3 may be substantially larger than the first width W1.

The first gate insulation layer 120 may be disposed on the base substrate 100 to cover the active pattern 110, and the first gate electrode 130 may be disposed on the first gate insulation layer 120. The first gate electrode 130 may be substantially the same as the first gate electrode 130 described with reference to FIGS. 2 and 3. In example embodiments, the first gate electrode 130 may have the first width W1 in the first direction D1, so that the first gate electrode 130 and the first channel region 112 may have the same width.

The second gate insulation layer 140 may be disposed on the first gate insulation layer 120 to cover the first gate electrode 130, and the second gate electrode 150 may be disposed on the second gate insulation layer 140. The second gate electrode 150 may be substantially the same as the second gate electrode 150 described with reference to FIGS. 2 and 3. In example embodiments, the second gate electrode 150 may have a second width W2 in the first direction D1, and the second width W2 of the second gate electrode 150 may be smaller than the third width W3 of the second channel region 116. Therefore, some portions of the second channel region 116 may overlap the second gate electrode 150, while other portions of the second channel region 116 may not overlap the second gate electrode 150.

According to example embodiments, the thin film transistor of the display substrate may include the active pattern 110, the first gate electrode 130 and the second gate electrode 150. The second distance T2 between the active pattern 110 and the second gate electrode 150 may be larger than the first distance T1 between the active pattern 110 and the first gate electrode 130. Therefore, the second gate electrode 150 may effectively prevent or reduce the leakage current. Further, the second width W2 of the second gate electrode 150 may be smaller than the third width W3 of the second channel region 116, so that the thin film transistor may has an offset structure. Accordingly, the leakage current may be further prevented or reduced.

Figure 5:
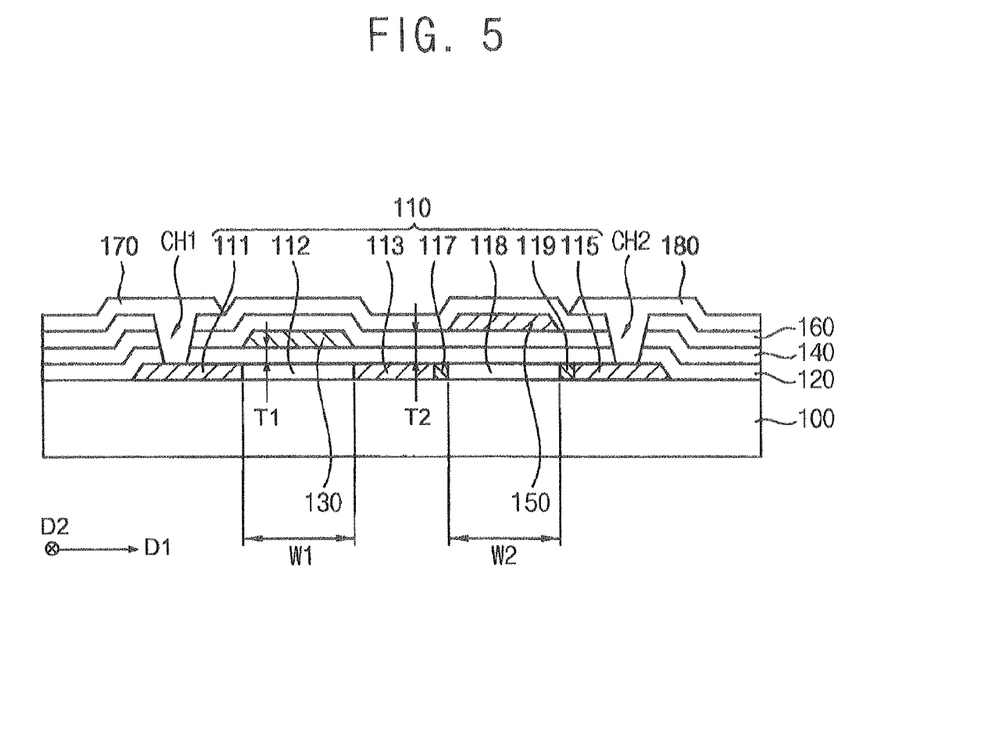
FIG. 5 is a cross-sectional view cut along the line III-III' in FIG. 2 in accordance with some example embodiments.

FIG. 5 is a cross-sectional view cut along the line III-III' in FIG. 2 in accordance with some example embodiments.

In reference to FIG. 5, a display substrate may include a thin film transistor, and the thin film transistor may include a base substrate 100, an active pattern 110, a first gate insulation layer 120, a first gate electrode 130, a second gate insulation layer 140, a second gate electrode 150, an insulation layer 160, a source electrode 170 and a drain electrode 180.

The active pattern 110 may be disposed on the base substrate 100. In example embodiments, the active pattern 110 may be divided into a first impurity region 111, a second impurity region 113, a third impurity region 115, a fourth impurity region 117, a fifth impurity region 119, a first channel region 112 and a second channel region 118. In this case, the impurity regions 111, 113, 115, 117 and 119 may have impurity concentration which may be larger than those of the first channel region 112 and the second channel region 118.

In example embodiments, the first channel region 112 may be disposed between the first impurity region 111 and the second impurity region 113, and the second channel region 118 may be disposed between the second impurity region 113 and the third impurity region 115. Further, the fourth impurity region 117 may be disposed between the second impurity region 113 and the second channel region 118, and the fifth impurity region 119 may be disposed between the third impurity region 115 and the second channel region 118.

The fourth impurity region 117 may have an impurity concentration which may be substantially smaller than that of the second impurity region 113, and the fifth impurity region 119 may have an impurity concentration which may be substantially smaller than that of the third impurity region 115. That is, the fourth impurity region 117 and/or the fifth impurity region 119 may serve as a lightly doped drain (LDD).

The first gate insulation layer 120 may be disposed on the base substrate 100 to cover the active pattern 110, and the first gate electrode 130 may be disposed on the first gate insulation layer 120. The first gate electrode 130 may be substantially the same as the first gate electrode 130 described with reference to FIGS. 2 and 3. In example embodiments, the first gate electrode 130 may overlap the first channel region 112.

The second gate insulation layer 140 may be disposed on the first gate insulation layer 120 to cover the first gate electrode 130, and the second gate electrode 150 may be disposed on the second gate insulation layer 140. The second gate electrode 150 may be substantially the same as the second gate electrode 150 described with reference to FIGS. 2 and 3. In example embodiments, the second gate electrode 150 may overlap the second channel region 118, and the second gate electrode 150 may not overlap the fourth impurity region 117 and the fifth impurity region 119. In example embodiments, the first gate electrode 130 may have a first width W1 in the first direction D1, the first width W1 of the first gate electrode 130 may be substantially the same as that of the first channel region 112. In example embodiments, the second gate electrode 150 may have a second width W2 in the first direction D1, the second width W2 of the second gate electrode 150 may be substantially the same as that of the second channel region 118.

According to example embodiments, the thin film transistor of the display substrate may include the active pattern 110, the first gate electrode 130 and the second gate electrode 150. The second distance T2 between the active pattern 110 and the second gate electrode 150 may be larger than the first distance T1 between the active pattern 110 and the first gate electrode 130. Therefore, the second gate electrode 150 may effectively prevent or reduce the leakage current. Further, the fourth impurity region 117 and the fifth impurity region 119 disposed adjacent to the second channel region 116 may effectively prevent or reduce the leakage current.

FIGS. 6 through 10 are cross-sectional views illustrating a method of manufacturing a display substrate in accordance with some example embodiments.

Figure 6:
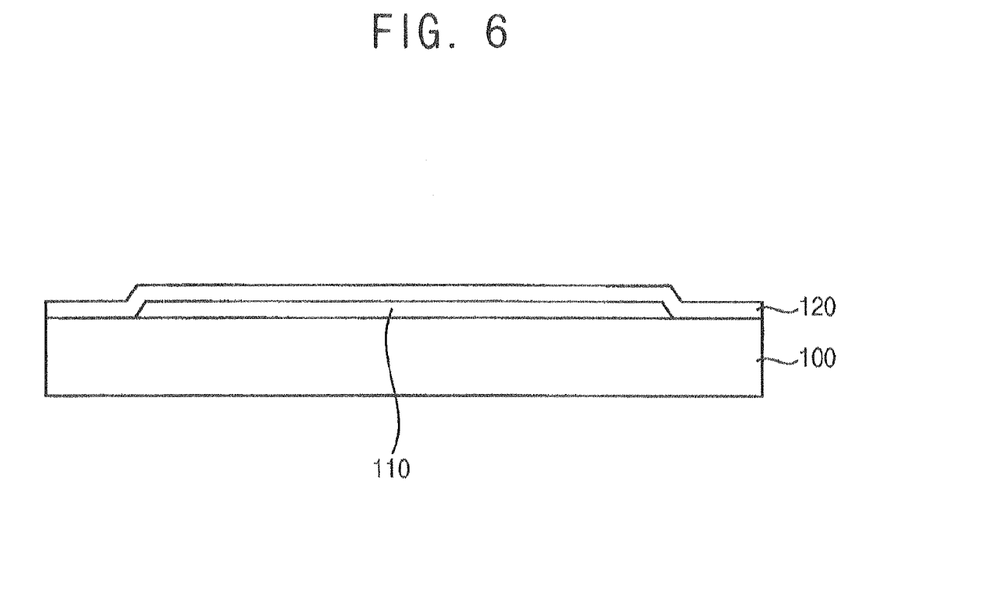
FIGS. 6 through 10 are cross-sectional views illustrating a method of manufacturing a display substrate in accordance with some example embodiments.

In reference to FIG. 6, an active pattern 110 and a first gate insulation layer 120 may be formed on a base substrate 100.

A semiconductor layer may be formed on the base substrate 110, and the semiconductor layer may be patterned to form the active pattern 110. In some example embodiments, the semiconductor layer may be formed by a chemical vapor deposition (CVD) process or a sputtering process using amorphous silicon. Then, the amorphous silicon may be partially or sufficiently crystallized by a heat treatment process. In other example embodiments, the semiconductor layer may be formed by a sputtering process using an oxide semiconductor material.

Then, the first gate insulation layer 120 may be formed by a CVD process using silicon oxide or silicon nitride.

Figure 7:
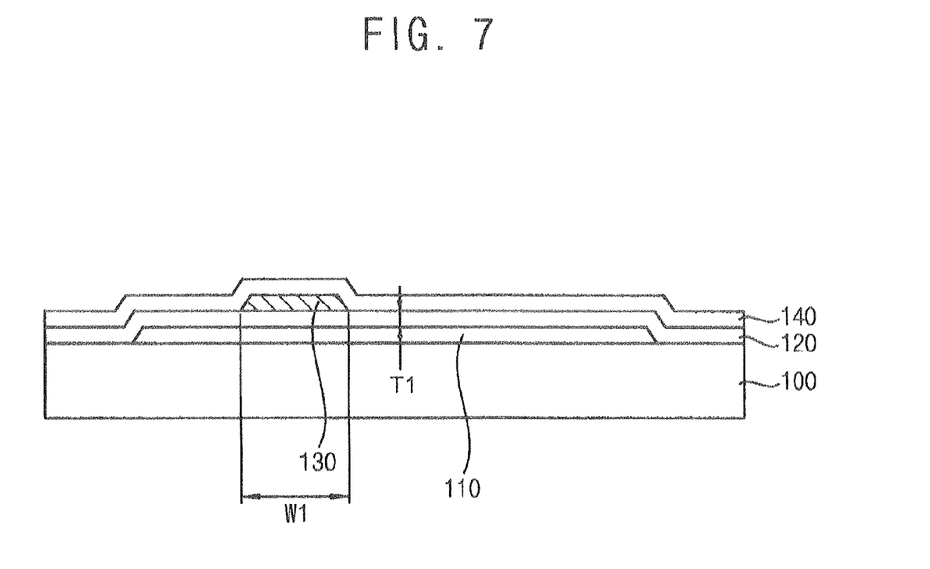

In reference to FIG. 7, a first gate electrode 130 and a second gate insulation layer 140 may be formed on the first gate insulation layer 120.

A first gate electrode layer and a first photoresist pattern may be formed on the first gate insulation layer 120, and the first gate electrode layer may be partially removed using the first photoresist pattern as an etching mask. In example embodiment, the first gate electrode 130 may have a first width W1 in a first direction D1. The first width W1 of the first gate electrode 130 may be the minimum length for the patterning process for forming the first gate electrode 130. For example, the first width W1 may be between about 2 μm to about 4 μm.

Further, a first gate line electrically connected to the first gate electrode 130 may be formed simultaneously during the process for forming the first gate electrode 130.

Then, the second gate insulation layer 140 may be formed by a CVD process using silicon oxide or silicon nitride.

Figure 8:
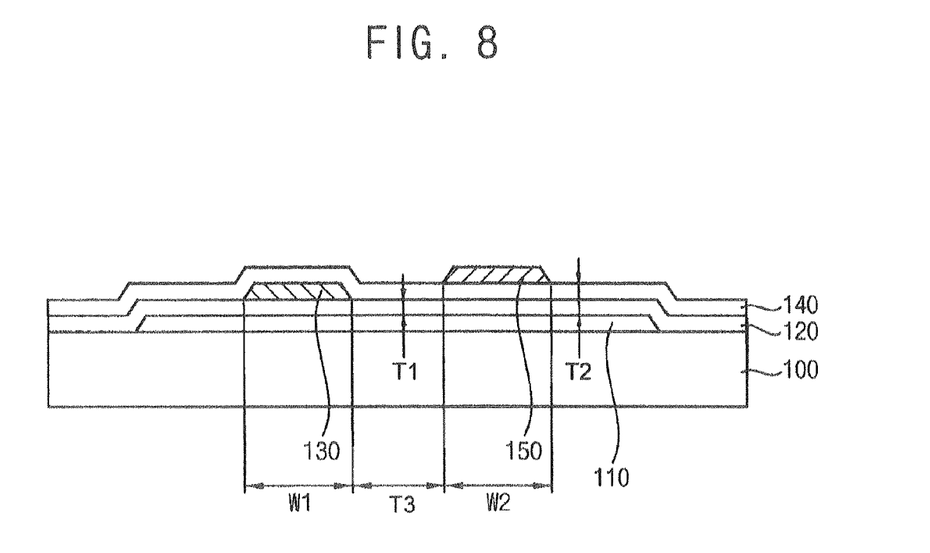

In reference to FIG. 8, a second gate electrode 150 may be formed on the second gate insulation layer 140.

A second gate electrode layer and a second photoresist pattern may be formed on the second gate insulation layer 140, and the second gate electrode layer may be partially removed using the second photoresist pattern as an etching mask. In example embodiment, the second gate electrode 150 may have a second width W2 in the first direction D1. The second width W2 of the second gate electrode 150 may be the minimum length for the patterning process for forming the second gate electrode 150. For example, the second width W2 may be between about 2 μm to about 4 μm.

The first gate electrode 130 and the second gate electrode 150 may be spaced apart from each other by a third distance T3. The third distance T3 may be substantially smaller than the first width W1 and the second width W2. For example, the third distance T3 may be between about 0.7 μm to about 2 μm. The first gate electrode 130 and the second gate electrode 150 may be disposed at different levels, so that the third distance T3 may be smaller than a resolution of an etching process for forming the first gate electrode 130 or the second gate electrode 150. As the third distance T3 decreases, an area occupied by the thin film transistor may decrease.

Further, a second distance T2 between the active pattern 110 and the second gate electrode 150 may be larger than a first distance T1 between the active pattern 110 and the first gate electrode 130. Therefore, the second gate electrode 150 may effectively prevent or reduce the leakage current.

A second gate line electrically connected to the second gate electrode 150 may be formed simultaneously during the process for forming the second gate electrode 150.

Figure 9:
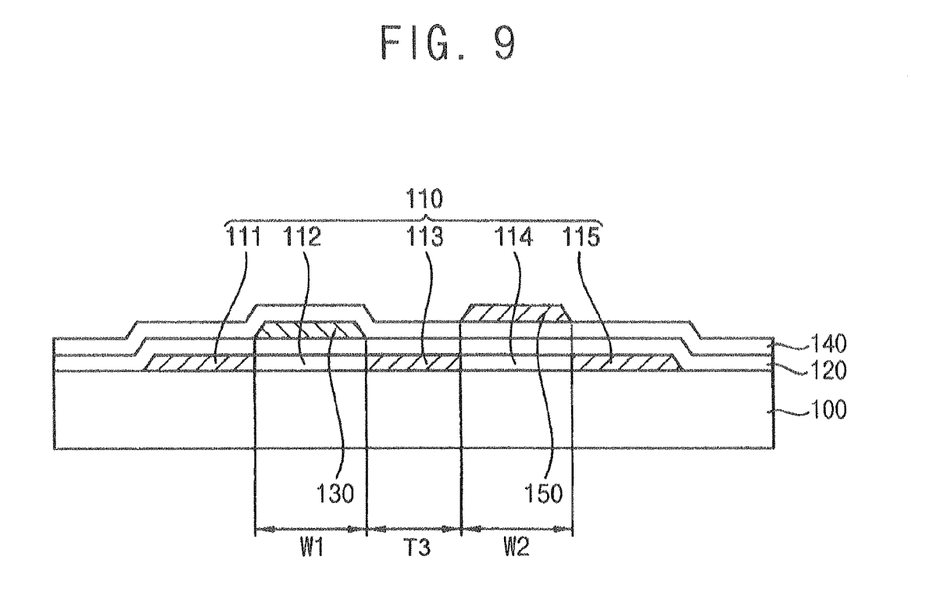

In reference to FIG. 9, impurities may be implanted into the active pattern 110, thereby forming the first impurity region 111, a second impurity region 113 and a third impurity region 115.

The impurity implantation process may be performed using the first gate electrode 130 and the second gate electrode 150 as an ion implantation mask. Therefore, impurities may not be doped into portions of the active pattern 110 which may be covered by the first gate electrode 130 and the second gate electrode 150. A first channel region 112 may be defined as a portion between the first impurity region 111 and the second impurity region 113, and a second channel region 114 may be defined as a portion between the second impurity region 113 and the third impurity region 115.

Figure 10:
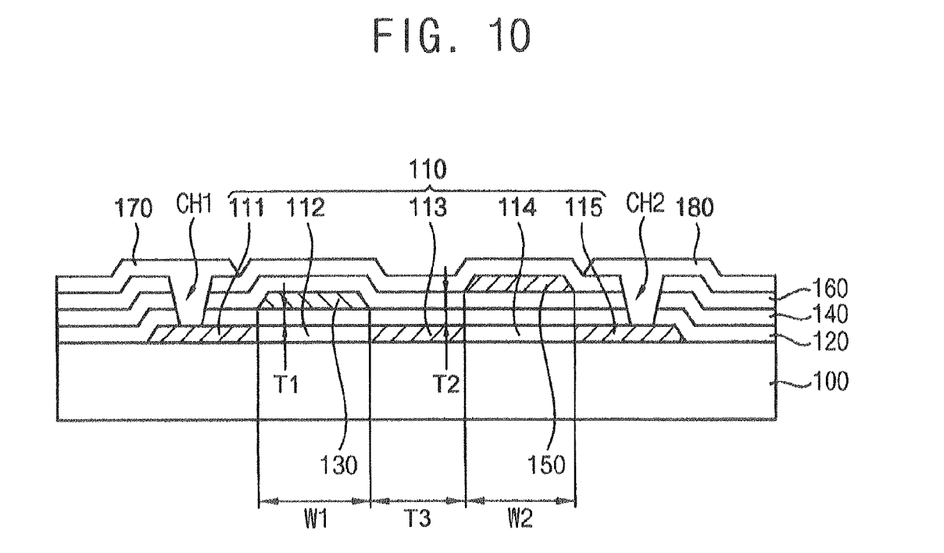

In reference to FIG. 10, an insulation layer 160 may be formed to cover the second gate electrode 150, and a source electrode 170 and a drain electrode 180 may be formed on the insulation layer 160.

The insulation layer 160 may be formed by a CVD process using silicon oxide or silicon nitride.

In example embodiments, the insulation layer 160, the second gate insulation layer 140 and the first gate insulation layer 120 may be partially removed to form contact holes exposing the first impurity region 111 and the third impurity region 113 of the active pattern, and then the source electrode 170 and the drain electrode 180 may be formed to fill the contact holes.

FIGS. 11 through 14 are cross-sectional views illustrating a method of manufacturing a display substrate in accordance with some example embodiments. The method illustrated in FIG. 11 through 14 may be substantially the same as or similar to that illustrated in FIGS. 6 through 10, except for a second impurity region 116. Thus, like reference numerals refer to like elements, and repetitive explanations thereon may be omitted herein.

Firstly, processes substantially the same as or similar to those illustrated with reference to FIGS. 6 and 7 may be performed. That is, an active pattern 110 and a first gate insulation layer 120 may be formed on a base substrate 100, and a first gate electrode 130 and a second gate insulation layer 140 may be formed on the first gate insulation layer 120.

Figure 11:
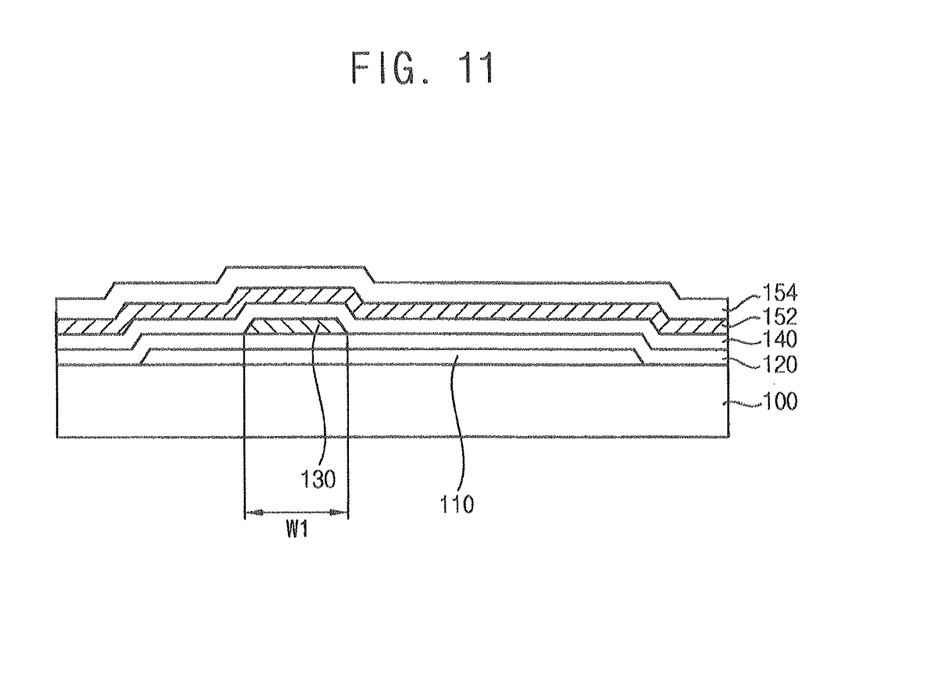
FIGS. 11 through 14 are cross-sectional views illustrating a method of manufacturing a display substrate in accordance with some example embodiments.

In reference to FIG. 11, a second gate electrode layer 152 and a second photoresist layer 154 may be formed on the second gate insulation layer 140.

The second gate electrode layer 152 may be formed by a CVD process or a sputtering process using copper, silver, chromium, molybdenum, aluminum, titanium, manganese, aluminum or alloys thereof.

Then, the second photoresist layer 154 may be formed on the second gate electrode layer 152 by a spin coating process.

Figure 12:
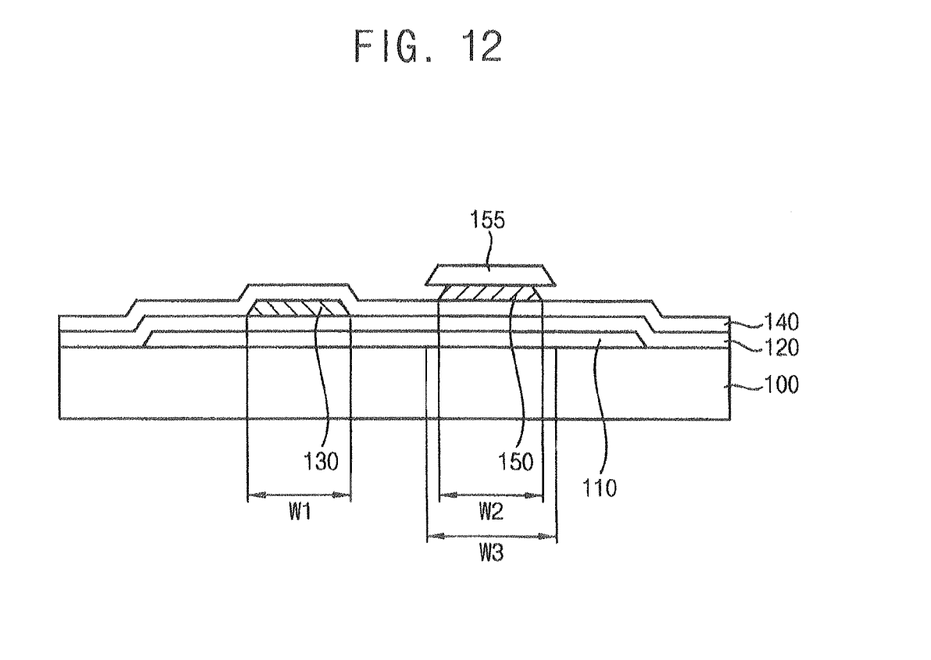

In reference to FIG. 12, the second photoresist pattern 154 may be partially removed to form a second photoresist pattern 155, and then the second gate electrode layer 152 may be partially removed using the second photoresist pattern 155, thereby forming the second gate electrode 150.

In example embodiment, the second photoresist pattern 155 may be formed by an exposure process and a development process. In example embodiments, the second photoresist pattern 155 may have a third width W3 which may be larger than the first width W1 of the first electrode 130.

Then, the second gate electrode layer 152 may be partially etched using the second photoresist pattern 155 as an etching mask. The etching process may use an etching solution or an etch gas which may have relatively high etch rate about the second gate electrode layer 152. Therefore, the second gate electrode 150 may have a width which may smaller than that of the second photoresist pattern 155. For example, the second gate electrode 150 may have a second width W2.

Figure 13:
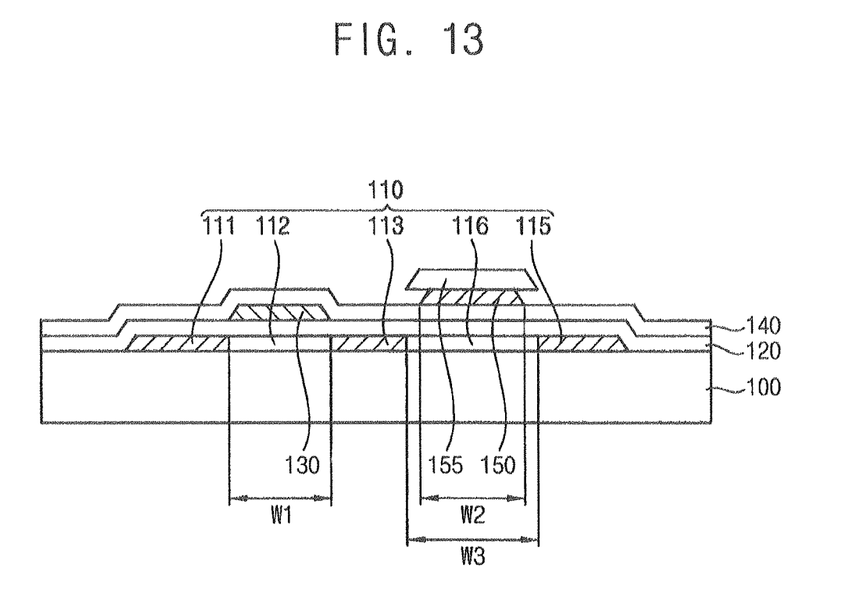

In reference to FIG. 13, impurities may be implanted into the active pattern 110, thereby forming the first impurity region 111, a second impurity region 113 and a third impurity region 115.

The impurity implantation process may be performed using the first gate electrode 130 and the second photoresist pattern 155 as an ion implantation mask. Therefore, impurities may not be doped into portions of the active pattern 110 which may be covered by the first gate electrode 130 and the second photoresist pattern 155. A first channel region 112 may be defined as a portion between the first impurity region 111 and the second impurity region 113, and a second channel region 116 may be defined as a portion between the second impurity region 113 and the third impurity region 115. Therefore, the second channel region 116 may have the third width W3 which may be substantially the same as that of the second photoresist pattern 115.

The second electrode 150 may partially overlap the second channel region 116. Therefore, some portions of the second channel region 116 may overlap the second gate electrode 150, while other portions of the second channel region 116 may not overlap the second gate electrode 150. Therefore, the thin film transistor may have an offset structure, and the thin film transistor may effectively prevent or reduce the leakage current.

Then, the second photoresist pattern 155 may be removed by an ashing process or a strip process.

Figure 14:
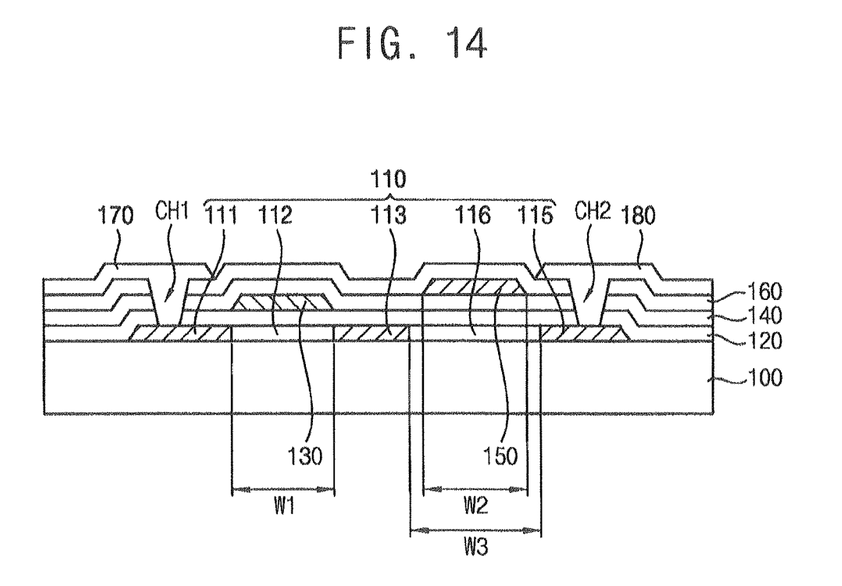

In reference to FIG. 14, an insulation layer 160 may be formed to cover the second gate electrode 150, and a source electrode 170 and a drain electrode 180 may be formed on the insulation layer 160. Processes for forming the insulation layer 160, the source electrode 170 and the drain electrode 180 may be substantially the same as or similar to that illustrated in FIG. 10.

Figure 15:
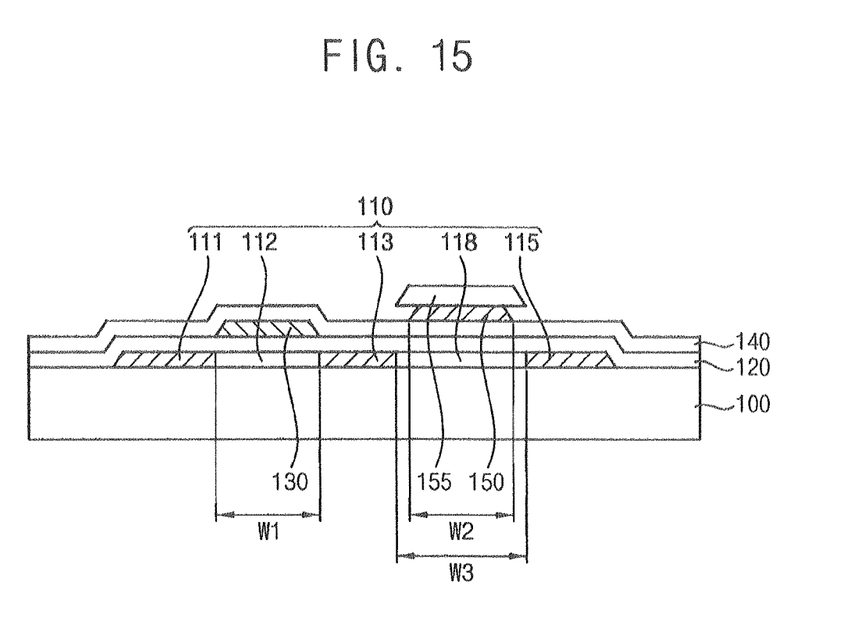
FIGS. 15 through 17 are cross-sectional views illustrating a method of manufacturing a display substrate in accordance with some example embodiments.
Figure 16:
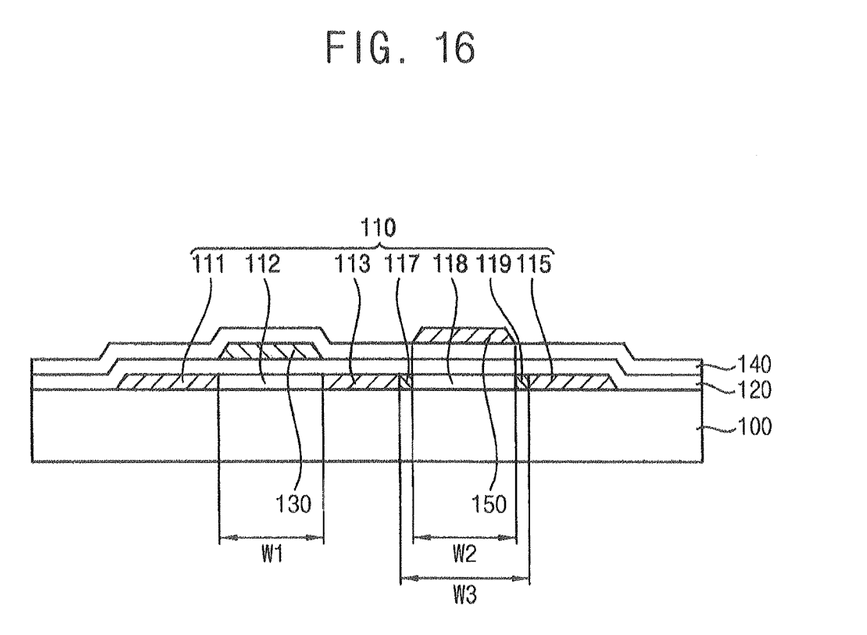
Figure 17:
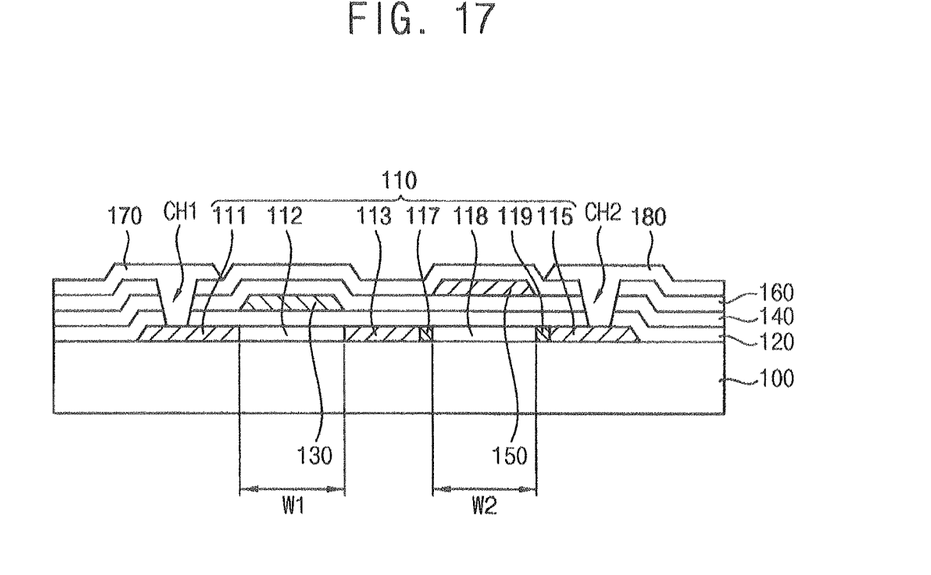

FIGS. 15 through 17 are cross-sectional views illustrating a method of manufacturing a display substrate in accordance with some example embodiments. The method illustrated in FIG. 15 through 17 may be substantially the same as or similar to that illustrated in FIGS. 11 through 14, except for a fourth impurity region 117 and a fifth impurity region 119. Thus, like reference numerals refer to like elements, and repetitive explanations thereon may be omitted herein.

In reference to FIG. 15, processes substantially the same as or similar to those illustrated with reference to FIGS. 11 to 13 may be performed.

That is, an active pattern 110 and a first gate insulation layer 120 may be formed on a base substrate 100, and a first gate electrode 130 and a second gate insulation layer 140 may be formed on the first gate insulation layer 120. Then, a second gate electrode 150 and a second photoresist 155 may be formed on the second gate insulation layer 140, and first impurities may be implanted into the active pattern 110, thereby forming the first impurity region 111, a second impurity region 113 and a third impurity region 115.

In reference to FIG. 16, the second photoresist pattern 155 may be removed, and second impurities may be implanted into the active pattern 110, thereby forming the fourth impurity region 117 and the fifth impurity region 119.

The second impurity implantation process may be performed using the first gate electrode 130 and the second gate electrode 150 as an ion implantation mask. Therefore, impurities may not be doped into portions of the active pattern 110 which may be covered by the first gate electrode 130 and second electrode 150.

A concentration of the second impurities may be substantially smaller than that of the first impurities. Therefore, the fourth impurity region 117 may have an impurity concentration which may be substantially smaller than that of the second impurity region 113, and the fifth impurity region 119 may have an impurity concentration which may be substantially smaller than that of the third impurity region 115. That is, the fourth impurity region 117 and/or the fifth impurity region 119 may serve as a lightly doped drain (LDD).

In reference to FIG. 17, an insulation layer 160 may be formed to cover the second gate electrode 150, and a source electrode 170 and a drain electrode 180 may be formed on the insulation layer 160. Processes for forming the insulation layer 160, the source electrode 170 and the drain electrode 180 may be substantially the same as or similar to that illustrated in FIG. 10.

Figure 18:
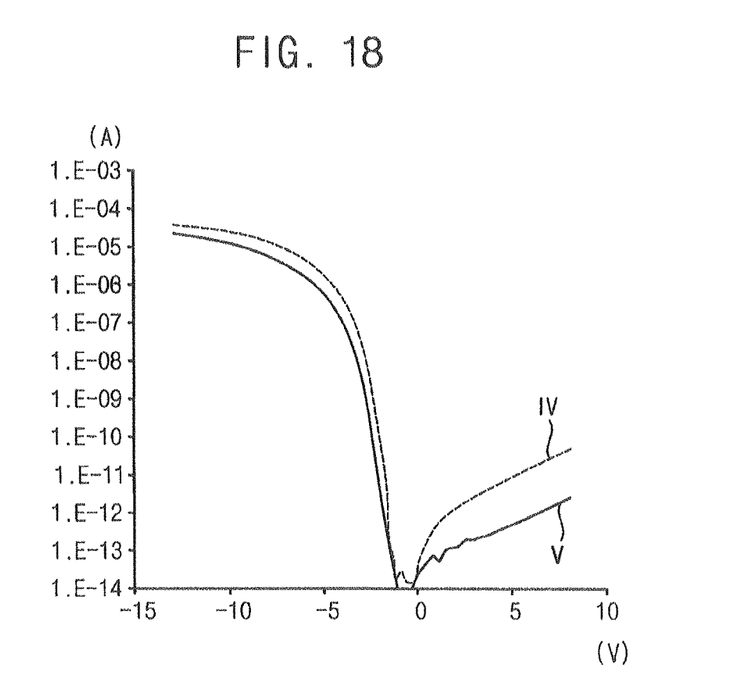
FIG. 18 is a graph showing a leakage current of thin films transistors depending on a thickness of an insulation layer.

FIG. 18 is a graph showing a leakage current of thin films transistors depending on a thickness of an insulation layer.

Thin film transistors having a top gate structure were formed. That is, an active pattern was formed on a base substrate, and a gate insulation layer was formed to cover the active pattern. Then, gate electrode was formed on the gate insulation layer, and an insulation layer was formed to cover the gate electrode. A source electrode and a drain electrode were further formed. The thicknesses of the gate insulation layer changed at each experiment. In a first experiment IV, the gate insulation layer had a thickness of about 1000 Å. In a second experiment V, the gate insulation layer had a thickness of about 2000 Å. Then, a current (axis Y) in a channel region was measured depending on a voltage at the gate electrode (axis X). As shown in FIG. 18, when the thickness of the gate insulation layer increases, the thin film transistor may effectively prevent or reduce a leakage current.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A display substrate comprising:
   an active pattern on a base substrate;
   a first gate electrode overlapping the active pattern, the first gate electrode spaced apart from the active pattern by a first distance;
   a second gate electrode overlapping the active pattern, the second gate electrode spaced apart from the active pattern by a second distance which is larger than the first distance;
   a first gate line electrically connected to the first gate electrode; and
   a second gate line electrically connected to the second gate electrode,
   wherein regions of the first gate line and the second gate line not overlapping the active pattern overlap each other and are electrically isolated by an insulation layer.

2. The display substrate of claim 1, wherein the active pattern includes a first impurity region, a second impurity region, a third impurity region, a first channel region and a second channel region, the first channel region is disposed between the first impurity region and the second impurity region, and the second channel region is disposed between the second impurity region and the third impurity region.

3. The display substrate of claim 2, further comprising:
   a source electrode electrically connected to the first impurity region of the active pattern; and
   a drain electrode electrically connected to the third impurity region of the active pattern.

4. The display substrate of claim 3, wherein the source electrode is disposed adjacent to the first gate electrode, and the drain electrode is disposed adjacent to the second gate electrode.

5. The display substrate of claim 2, wherein the active pattern further comprises:
   a fourth impurity region between the second channel region and the second impurity region; and
   a fifth impurity region between the second channel region and the third impurity region.

6. The display substrate of claim 5, wherein the fourth impurity region has an impurity concentration which is smaller than an impurity concentration of the second impurity region, and the fifth impurity region has an impurity concentration which is smaller than an impurity concentration of the third impurity region.

7. The display substrate of claim 2, wherein the second channel region overlaps the second gate electrode, and the second channel region has a width which is the same as a width of the second electrode.

8. The display substrate of claim 2, wherein the second channel region overlaps the second gate electrode, and the second channel region has a width which is larger than a width of the second electrode.

9. The display substrate of claim 1, further comprising:
   a first gate insulation layer on the base substrate, the first gate insulation layer covering the active pattern; and
   a second gate insulation layer on the first gate insulation layer, the second gate insulation layer covering the first gate electrode,
   the first gate electrode disposed on the first gate insulation layer, and the second gate electrode disposed on the second gate insulation layer.

10. The display substrate of claim 1, wherein the first gate electrode does not overlap the second gate electrode.

11. The display substrate of claim 1, wherein the first gate electrode has a first width, the second gate electrode has a second width, and the first gate electrode and the second gate electrode are spaced apart from each other by a third distance which is smaller than the first width or the second width.

12. The display substrate of claim 1, wherein the first gate line and the second gate line are partially overlapped from each other.

13. A method of manufacturing a display substrate, the method comprising:
   forming an active pattern on a base substrate;
   forming a first gate insulation layer on the base substrate to cover the active pattern;
   forming a first gate electrode on the first gate insulation layer, the first gate electrode overlapping the active pattern and electrically connected to a first gate line;
   forming a second gate insulation layer on the first gate insulation layer to cover the first gate electrode; and
   forming a second gate electrode on the second gate insulation layer, the second gate electrode overlapping the active pattern and electrically connected to a second gate line, and regions of the first gate line and the second gate line not overlapping the active pattern overlap each other.

14. The method of claim 13, wherein forming the second electrode comprises:
   forming a second gate electrode layer on the second gate insulation layer;
   forming a photoresist pattern on the second gate electrode layer; and
   partially removing the second gate electrode layer using the photoresist pattern as an etching mask.

15. The method of claim 14, further comprising:
   implanting first impurities into the active pattern using the photoresist pattern and the first gate electrode as an ion implanting mask,
   forming the photoresist pattern to have a width which is larger than a width of the second gate electrode.

16. The method of claim 15, further comprising:
removing the photoresist pattern; and
implanting second impurities into the active pattern using the first gate electrode and the second gate electrode as an ion implanting mask,
making a concentration of the second impurities smaller than a concentration of the first impurities.

17. The method of claim 13, further comprising implanting impurities into the active pattern using the first gate electrode and the second gate electrode as an ion implanting mask.

18. The method of claim 17, wherein implanting the impurities includes forming a first impurity region, a second impurity region and a third impurity region in the active pattern, a first channel region is defined as a region between the first impurity region and the second impurity region, and a second channel region is defined as a region between the second impurity region and the third impurity region.

* * * * *